US012681057B2

(12) United States Patent
Gao et al.

(10) Patent No.: US 12,681,057 B2
(45) Date of Patent: Jul. 14, 2026

(54) TIME ALIGNMENT METHOD OF DIFFERENTIAL PROTECTION DEVICE, DIFFERENTIAL PROTECTION DEVICE AND DIFFERENTIAL PROTECTION SYSTEM

(71) Applicant: Schneider Electric Industries SAS, Rueil-Malmaison (FR)

(72) Inventors: Yansong Gao, Shanghai (CN); Ian Young, Ingleburn (AU); Xuedi Liang, Shanghai (CN); Yong Wei, Shanghai (CN)

(73) Assignee: Schneider Electric Industries SAS, Rueil Malmaison (FR)

( * ) Notice: Subject to any disclaimer, the term of this patent is extended or adjusted under 35 U.S.C. 154(b) by 633 days.

(21) Appl. No.: 18/102,891

(22) Filed: Jan. 30, 2023

(65) Prior Publication Data

US 2023/0243875 A1     Aug. 3, 2023

(30) Foreign Application Priority Data

Jan. 30, 2022    (CN) .......................... 202210113257.2

(51) Int. Cl.
*G01R 19/25*          (2006.01)

(52) U.S. Cl.
CPC ..... *G01R 19/2509* (2013.01); *G01R 19/2513* (2013.01)

(58) Field of Classification Search
CPC ............ G01R 19/2509; G01R 19/2513; H02H 3/305; H02H 7/226; H02H 7/263;
(Continued)

(56) References Cited

U.S. PATENT DOCUMENTS

2020/0112447 A1 *    4/2020    Rajasekaran ........... H04L 12/10
2023/0143318 A1 *    5/2023    Bobick ................... G01R 23/02
                                                              702/61

FOREIGN PATENT DOCUMENTS

KR          101108683 B1 *   1/2012   ............... H02H 3/28

OTHER PUBLICATIONS

Soeren de Rose, "Precise Amplitude and Phase Determination Using Resampling Algorithms for Calibrating Sampled Value Instruments", Dec. 21, 2020, MDPI, pmc.ncbi.nlm.nih.gov/articles/PMC7767407/pdf/sensors-20-07345.pdf (Year: 2020).*

* cited by examiner

*Primary Examiner* — Yossef Korang-Beheshti
(74) *Attorney, Agent, or Firm* — Quinn IP Law

(57)                    ABSTRACT

A time alignment method for a differential protection device, the differential protection device and a differential protection system are disclosed. The time alignment method includes obtaining a plurality of current sampled values and a count value of each current sampled values; resampling the plurality of current sampled values with sampling frequency of J points/cycle to obtain a plurality of current resampled values; and performing Fourier transform on the plurality of current resampled values to obtain a plurality of temporally arranged current Fourier values, the plurality of current Fourier values includes a reference current Fourier value corresponding to the sampling moment of the current sampled value whose count value is the first value in the plurality of current sampled values, and the reference current Fourier value is determined based on the reference current resampled value and the J−1 current resampled values that temporally arranged before the reference current resampled value.

18 Claims, 9 Drawing Sheets

(58) Field of Classification Search
  CPC ..... H02H 1/0092; H04J 3/0635; H04L 12/40;
                    H04Q 9/00; H04Q 2209/30
  See application file for complete search history.

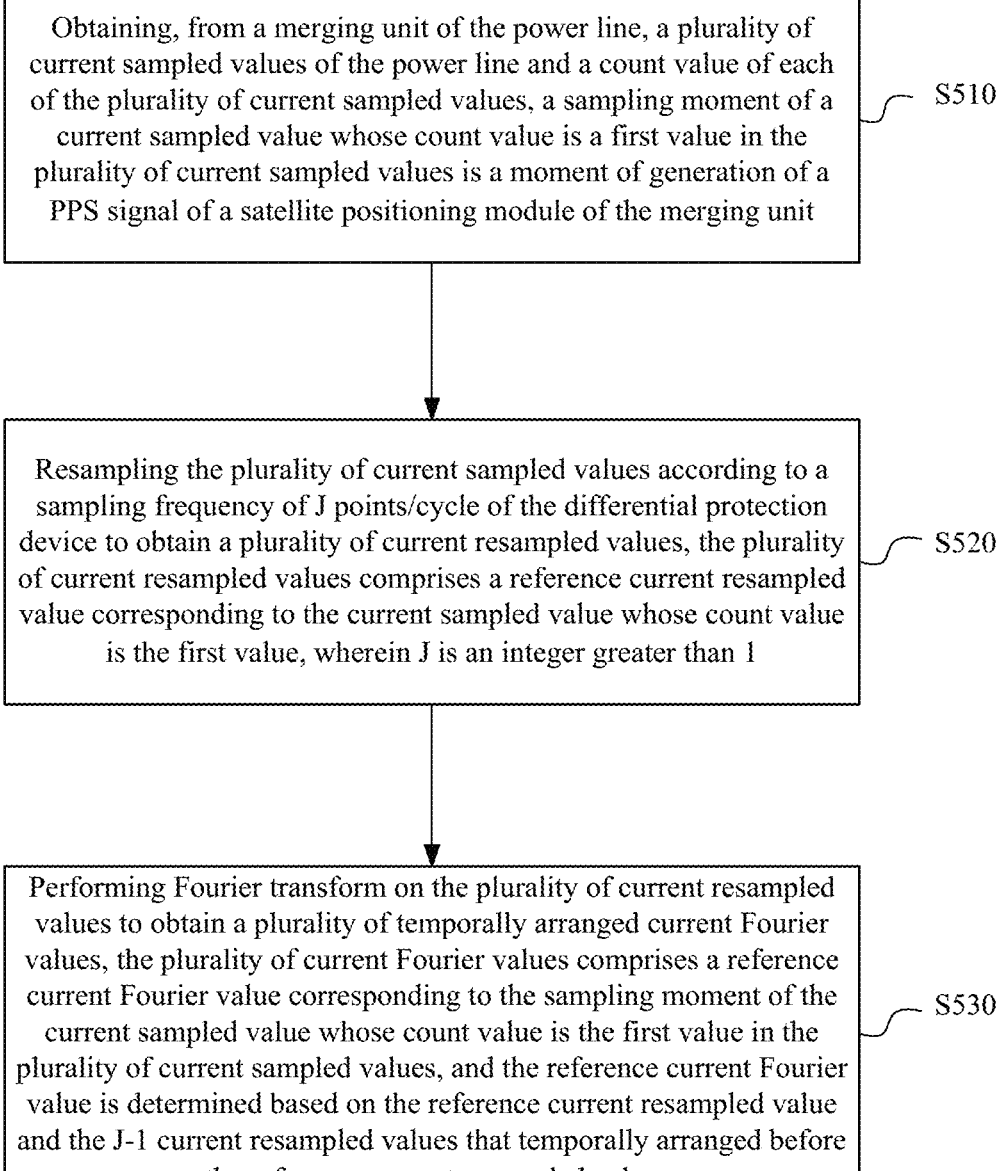

Obtaining, from a merging unit of the power line, a plurality of current sampled values of the power line and a count value of each of the plurality of current sampled values, a sampling moment of a current sampled value whose count value is a first value in the plurality of current sampled values is a moment of generation of a PPS signal of a satellite positioning module of the merging unit          S510

Resampling the plurality of current sampled values according to a sampling frequency of J points/cycle of the differential protection device to obtain a plurality of current resampled values, the plurality of current resampled values comprises a reference current resampled value corresponding to the current sampled value whose count value is the first value, wherein J is an integer greater than 1          S520

Performing Fourier transform on the plurality of current resampled values to obtain a plurality of temporally arranged current Fourier values, the plurality of current Fourier values comprises a reference current Fourier value corresponding to the sampling moment of the current sampled value whose count value is the first value in the plurality of current sampled values, and the reference current Fourier value is determined based on the reference current resampled value and the J-1 current resampled values that temporally arranged before the reference current resampled value          S530

FIG.5

| Communication Module 801 | Sampling Module 802 | Time Alignment Module 803 |
| --- | --- | --- |

Differential Protection Device 800

FIG.8

Current Transformer CT1

Merging Unit 401

Differential Protection Device 800

Differential Protection System 900

FIG.9

TIME ALIGNMENT METHOD OF DIFFERENTIAL PROTECTION DEVICE, DIFFERENTIAL PROTECTION DEVICE AND DIFFERENTIAL PROTECTION SYSTEM

TECHNICAL FIELD

This disclosure relates to a time alignment method of a differential protection device for a power line, a differential protection device that performs the time alignment method, and a differential protection system comprising the differential protection device.

BACKGROUND

According to the principle of differential protection, the differential protection device needs to obtain current sampled values from each end (two or more ends) of the differential protection areas, and these current sampled values must be aligned in time. Traditionally, parallel cables are used to communicate between the process level and bay level of the substation automation system. The differential protection device receives the current analog values directly from the current transformer and then converts and time-aligns the current analog values using the pulse per second (PPS) signal generated by its own satellite positioning module as the reference time. However, with the development of the substation automation system, it has evolved to use a process bus for communication between the process level and the bay level. Rather than receiving the current analog values directly from the current transformer, the differential protection device receives the current sampled value packets from the merging unit via the process bus. In this case, if the differential protection device still uses the PPS signal generated by its own satellite positioning module as the reference time, there may be a large error in time alignment results in case of, for example, through faults, which may cause a large safety risk.

SUMMARY

In view of the above problems of the prior art, an aspect of this disclosure provides a time alignment method for a differential protection device for the power line. The method comprises: obtaining, from a merging unit of the power line, a plurality of current sampled values of the power line and a count value of each of the plurality of current sampled values, a sampling moment of a current sampled value whose count value is a first value in the plurality of current sampled values is a moment of generation of a PPS signal of a satellite positioning module of the merging unit; resampling the plurality of current sampled values according to a sampling frequency of J points/cycle of the differential protection device to obtain a plurality of current resampled values, the plurality of current resampled values comprises a reference current resampled value corresponding to the current sampled value whose count value is the first value, wherein J is an integer greater than 1; and performing Fourier transform on the plurality of current resampled values to obtain a plurality of temporally arranged current Fourier values, the plurality of current Fourier values comprises a reference current Fourier value corresponding to the sampling moment of the current sampled value whose count value is the first value in the plurality of current sampled values, and the reference current Fourier value is determined based on the reference current resampled value and the J–1 current resampled values that temporally arranged before the reference current resampled value.

Another aspect of this disclosure provides a differential protection device for a power line. The device comprises a communication module, a sampling module, and a time alignment module. The communication module is configured for obtaining, from a merging unit of the power line, a plurality of current sampled values of the power line and a count value of each of the plurality of current sampled values, a sampling moment of a current sampled value whose count value is a first value in the plurality of current sampled values is a moment of generation of a PPS signal of a satellite positioning module of the merging unit. The sampling module is configured for resampling the plurality of current sampled values according to a sampling frequency of J points/cycle of the differential protection device to obtain a plurality of current resampled values, the plurality of current resampled values comprises a reference current resampled value corresponding to the current sampled value whose count value is the first value, wherein J is an integer greater than 1. The time alignment module is configured for performing Fourier transform on the plurality of current resampled values to obtain a plurality of temporally arranged current Fourier values, the plurality of current Fourier values comprises a reference current Fourier value corresponding to the sampling moment of the current sampled value whose count value is the first value in the plurality of current sampled values, and the reference current Fourier value is determined based on the reference current resampled value and the J–1 current resampled values that temporally arranged before the reference current resampled value.

Another aspect of this disclosure provides a differential protection system for a power line. The system comprises a current transformer, a merging unit and a differential protection device. The current transformer is configured for measuring current analog values of the power line. The merging unit is configured for generating a plurality of original current sampled values by sampling the current analog values, obtaining a plurality of current sampled values by interpolating the plurality of original current sampled values, and tagging each current sampled value with a count value, a sampling moment of a current sampled value whose count value is a first value in the plurality of current sampled values is a moment of generation of a PPS signal of a satellite positioning module of the merging unit. The differential protection device is for obtaining, from a merging unit of the power line, a plurality of current sampled values of the power line and a count value of each current sampled value; resampling the plurality of current sampled values according to a sampling frequency of J points/cycle of the differential protection device to obtain a plurality of current resampled values, the plurality of current resampled values comprises a reference current resampled value corresponding to the current sampled value whose count value is the first value, wherein J is an integer greater than 1; and performing Fourier transform on the plurality of current resampled values to obtain a plurality of temporally arranged current Fourier values, the plurality of current Fourier values comprises a reference current Fourier value corresponding to the sampling moment of the current sampled value whose count value is the first value in the plurality of current sampled values, and the reference current Fourier value is determined based on the reference current resampled value and the J–1 current resampled values that temporally arranged before the reference current resampled value.

BRIEF DESCRIPTION OF DRAWINGS

FIG. 5 is a flowchart of a time alignment method according to embodiments of this disclosure;

FIG. 8 is a schematic block diagram of the differential protection device according to embodiments of this disclosure; and FIG. 9 is a schematic block diagram of the differential protection system according to embodiments of this disclosure.

DETAILED DESCRIPTION

This disclosure will be described in detail below with reference to exemplary embodiments of this disclosure. However, this disclosure is not limited to the embodiments described herein and it may be implemented in many different forms. The described embodiments are only used to make this disclosure thorough and complete, and to fully convey the novel concept of this disclosure to those skilled in the art. The features of the various described embodiments may be combined or replaced with each other unless explicitly excluded or should be excluded according to the context.

Unless otherwise defined, technical terms or scientific terms used in this disclosure shall have the ordinary meaning as understood by persons having ordinary skill in the art to which this disclosure belongs. The terms "first", "second" and the like, as used in this disclosure, do not indicate any order, number, or importance, but are used only to distinguish the different components.

Figure 1:
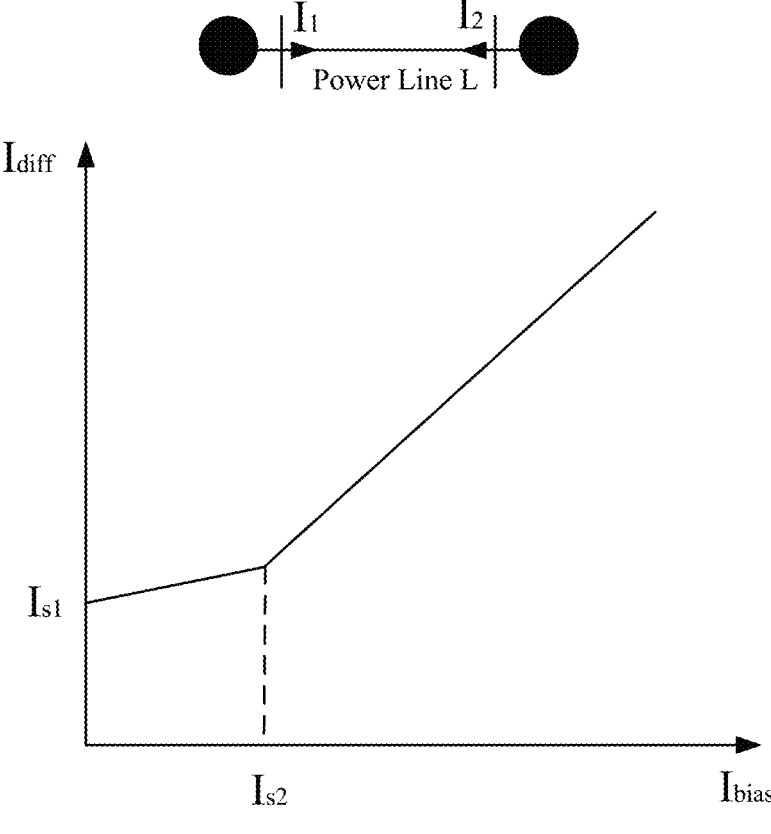
FIG. 1 is a schematic diagram of the principle of differential protection of a power line.

FIG. 1 is a schematic diagram of the differential protection principle of the power line.

Referring to FIG. 1, the principle of differential protection of power line L is to determine whether the differential protection action for power line L should be triggered (e.g., to disconnect the associated circuit breaker, etc.) according to whether the differential current of the power line L is zero, i.e., whether the vector sum of currents $I_1$ and $I_2$ at both ends of the power line L is zero.

For example, it can be determined whether the differential protection action of the power line L should be triggered according to the following criteria.

For $I_{bias} < I_{s2}$, triggered when $|I_{diff}| > k_1 |I_{bias}| + I_{s1}$;

For $I_{bias} > I_{s2}$, triggered when $|I_{diff}| > k_2 |I_{bias}| - (k_2 - k_1) I_{s2} + I_{s1}$;

wherein:

$$I_{bias} = \frac{|I_1| + |I_2|}{2}$$

is the bias current of the power line L, i.e., the mean value of the scalar sum of the currents at both ends of the power line L;

$I_{diff} = I_1 + I_2$ is the differential current of the power line L, i.e., the vector sum of the currents at both ends of the power line L;

$k_1$ and $k_2$ are percentage of the bias;

The values of $I_{s1}$, $I_{s2}$, $k_1$ and $k_2$ may be selected according to the actual situation of the power line L. $I_1$ and $I_2$ herein refer to the fundamental wave components of the currents I1 and I2 at the two ends of the power line L, respectively.

FIG. 1 shows the power line L including two ends as the protection area for example only, and the protection area including more ends is also possible. For example, if one side of the protection area is a busbar substation and the other sides of the protection area contain individual substations for multiple branches, for the differential protection device of the busbar substation, it is needed to consider the total vector sum of the current information on the one side and the current information of the individual substations on the other sides to determine whether the differential protection action for the protection area should be triggered.

Figure 2:
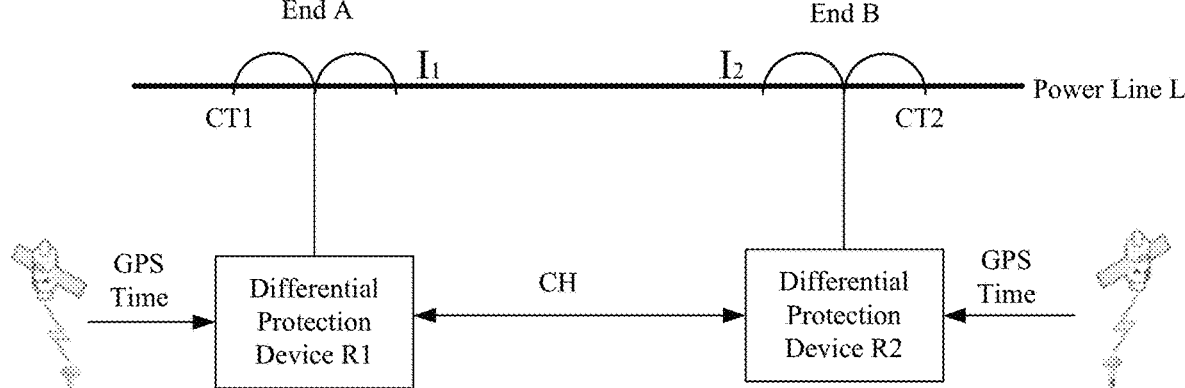
FIG. 2 is a diagram of an example usage scenario of a time alignment method according to the prior art.

FIG. 2 is a diagram of an example usage scenario of a time alignment method according to the prior art.

As mentioned earlier, the time alignment method according to the prior art is applicable to a substation automation system whose process level and bay level are connected by parallel cables therebetween, and the substations at the end A and end B of the power line L illustrated in FIG. 2 is such substation automation system.

As shown in FIG. 2, at end A, the current transformer CT1, as a process level device of the substation automation system at end A, measures the current analog values of end A. The differential protection device R1, as a bay level device of the substation automation system at end A, receives the current analog values from the current transformer CT1 via the parallel cables, and then processes the current analog values of end A according to the time alignment method according to the prior art to convert them into a time-aligned current digital values of end A. The arrangement at end B is similar to that at end A. The differential protection device R1 also processes the current analog values of end B according to the time alignment method according to the prior art to convert them into the time-aligned current digital values of end B. The differential protection devices R1 and R2 exchange the time-aligned current digital values between each other via the communication channel CH, and then make a differential protection decision on whether to trigger differential protection action based on the principle of differential protection shown in FIG. 1.

Each of the differential protection devices R1 and R2 has the satellite positioning module, which can receive a reference time source from a time-giving system such as Global Positioning System (GPS), BeiDou System (BDS), Galileo system and GLONASS and the like, and correct their own time based on the reference time source and generate PPS signal per second.

Figure 3:
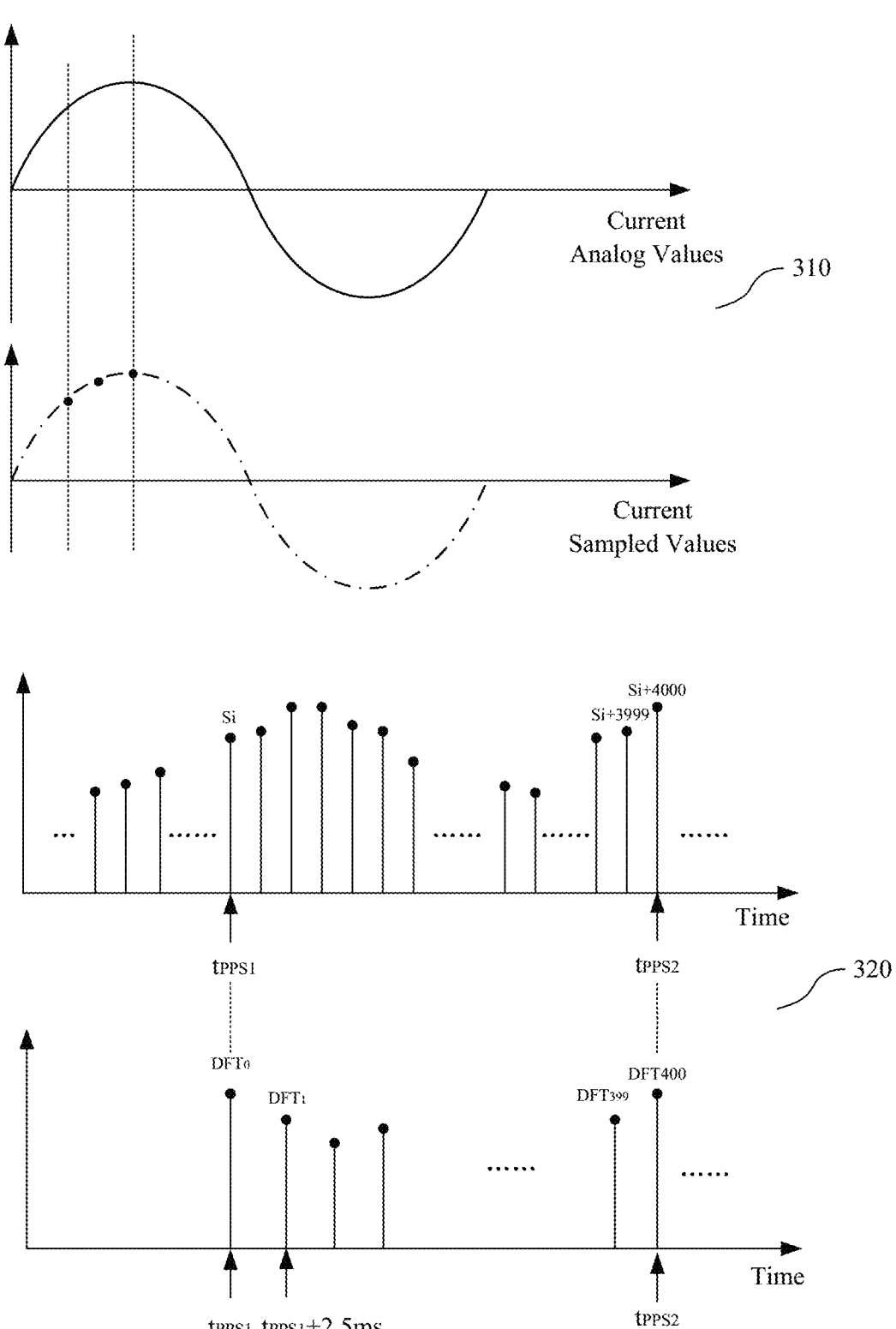
FIG. 3 is a diagram illustrating an example of the time alignment method according to the prior art.

FIG. 3 is a diagram illustrating an example of a time alignment method according to the prior art.

The time alignment method according to the prior art may be performed by the differential protection device R1 and/or R2 in FIG. 1. The method can be summarized, for example, in the following three steps: in the first step, the differential protection device R1 receives the current analog values from the current transformer CT1; in the second step, the differential protection device R1 samples the current analog values to obtain the current sampled values; in the third step, the differential protection device R uses the PPS signal generated by its own satellite positioning module as the reference time and performs Fourier transform on the obtained current sampled values to obtain a plurality of current Fourier values.

Referring to FIG. 3, which illustrates one example of a time alignment method according to the prior art. In the first step, the differential protection device R1 receives the current analog values from the current transformer CT1, as the sine wave in illustration 310 in FIG. 3. In the second step, the differential protection device R1 samples the current analog values according to its sampling frequency. Given the power frequency of 50 Hz and the sampling frequency of 48 points/cycle, the differential protection device R1 obtains 48 current sampled values per cycle, i.e., 2400 current sampled values per second. By interpolation or a similar way, it may be achieved that the sampling moment of one current sampled value in the 2400 current sampled values is just the moment when a PPS signal is generated by the satellite positioning module of the differential protection device R1. As shown in illustration 320, the sampling moment of the current sampled value Si is the moment $t_{pps1}$ which is the generation moment of the $1^{st}$ PPS signal of the satellite positioning module of the differential protection device R1, and the sampling moment of the current sampled value $S_{i+4000}$ is the moment $t_{pps2}$ which is the generation moment of the $2^{nd}$ PPS signal of the satellite positioning module of the differential protection device R1. In the third step, using the generation moments $t_{pps1}$ and $t_{pps2}$ as reference times, the differential protection device R1 iteratively, at an interval of 6 current sampled values, takes 48 continuous current sampling values and performs Fourier transformation on the taken 48 current sampled values to generate the current Fourier values $DFT_0 \sim DFT_{399}$ corresponding to the current sampled values $S_i \sim S_{i+3999}$ and $DFT_{400} \sim DFT_{799}$ corresponding to the current sampled values $S_{i+4000} \sim S_{i+7999}$, and the like. Since the time distance between the generation moments $t_{pps1}$ and $t_{pps2}$, i.e., the time distance of the two adjacent PPS signals, is 1 s, the time distance between the moments to which the two adjacent current Fourier values are aligned is 2.5 ms.

The differential protection device R2 at end B also generates the time-aligned current Fourier values in a similar manner using the generation moments of the PPS signals generated by its own satellite positioning module as the reference times. By exchanging the current information generated by each other via the communication channel CH which includes the current Fourier values and the moments to which the respective current Fourier values are aligned, the differential protection devices R1 and R2 can calculate the differential current at the target time according to the principle of differential protection shown in FIG. 1.

However, the time alignment method according to the prior art is not applicable to a substation automation system employing a process bus for communication, such as the substation automation system conforming to standard IEC61850-9-2.

Figure 4:
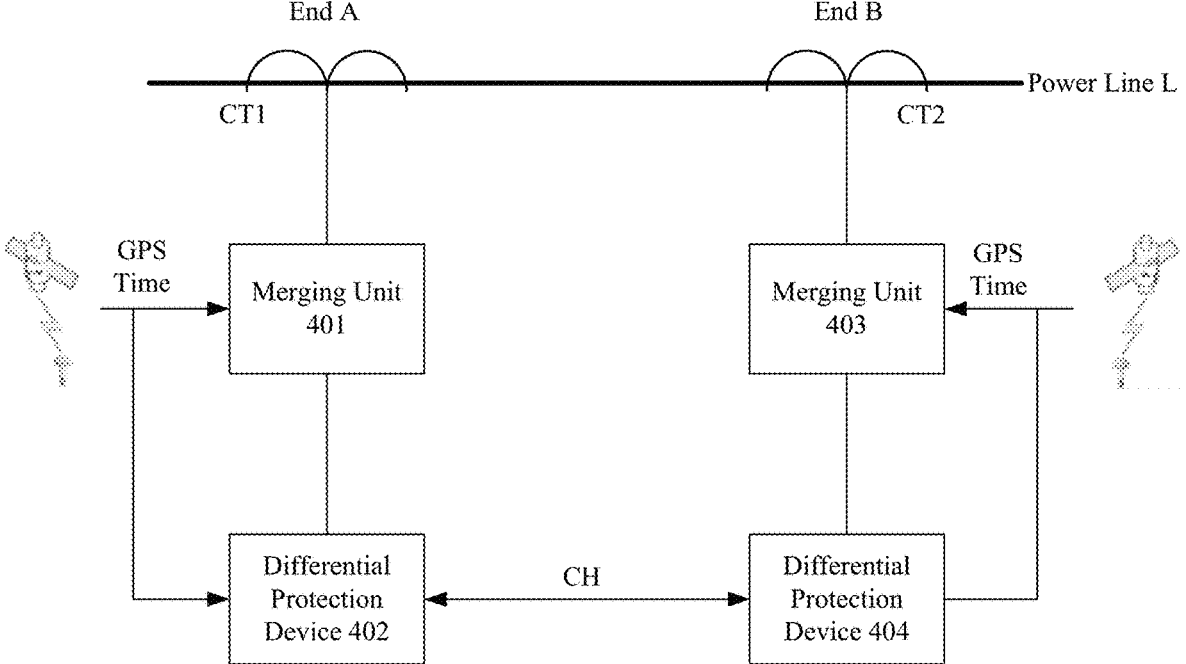
FIG. 4 is a diagram of an example usage scenario of a time alignment method according to embodiments of this disclosure.

FIG. 4 is a diagram of an example usage scenario of the time alignment method according to the embodiments of this disclosure.

Referring to FIG. 4, the substation automation systems employing process bus for communication are used at both end A and end B of the power line L.

At end A, the current transformer CT1 is used as a process level device of the substation automation system, which measures the current analog values of end A. The merging unit 401 is an important part of the interface between the process level and the bay level of the substation automation system at end A. One side of the merging unit 401 is connected to the current transformer CT1 via the parallel cables to receive the current analog values measured by the current transformer CT1 and then processes the received current analog values into the current sampled value packets. The other side of the merging unit 401 is connected to the differential protection device 402 that is a bay level device via the process bus and transmits the current sampled value packets to the differential protection device 402.

At end B, similar to end A, the current analog values of end B are measured by the current transformer CT2. The merging unit 403 receives the current analog values of end B from the current transformer CT2 via parallel cables, processes the current analog values into current sampled value packets and transmits the sampled value packets to the differential protection device 404 via the process bus.

Unlike FIG. 2, the merging unit 401 is introduced in the usage scenario of FIG. 4 and the transmission between the merging unit 401 and the differential protection device 402 does not rely on parallel cables but on the process bus, causing a large transmission delay that cannot be ignored for the differential protection. The transmission delay is unstable because the process bus may be subjected to various interference factors. If the differential protection devices 402 and 404 still use the time alignment method shown in FIG. 3, there may be a deviation between the moment to which the current Fourier value is aligned and the moment of the acquisition of the current value corresponding to the current Fourier value. This further leads to incorrect calculation of the differential current which may cause the differential protection device to make incorrect differential protection decisions in the case of large changes in current amplitude over a short period of time (e.g., in the case of through faults, etc.). In view of this, this disclosure proposes a time alignment method that can be applied to a substation automation system with a merging unit using a process bus for communication.

The differential protection devices 402 and 404 in FIG. 4 perform the conversion of the sampled values into the time-aligned current Fourier values according to the time alignment method of the embodiments of this disclosure. After the differential protection devices 402 and 404 exchange the time-aligned current Fourier values generated by each other via the communication channel CH, they can make the correct differential protection decision based on the principle of differential protection shown in FIG. 1.

The merging units 401 and 403 and the differential protection devices 402 and 404 each include the satellite positioning module for receiving the reference time source from a time-giving system such as GPS, BDS, Galileo or GLONASS and the like and generating PPS signals, as previously described.

The time alignment method according to embodiments of this disclosure is described below in connection with FIGS. 5 and 6.

FIG. 5 is the flowchart of the time alignment method according to embodiments of this disclosure. FIG. 6 is the schematic diagram of the data transformation of the time alignment method according to embodiments of this disclosure.

Referring to FIG. 5, the time alignment method 500 according to an embodiment of this disclosure includes steps S510 to S530. The time alignment method 500 may be performed by the differential protection device 402 and/or 404, as illustrated below with the differential protection device 402 as an example.

At step S510, the differential protection device 402 obtains a plurality of current sampled values of the power line L and a count value of each current sampled value from the merging unit 401. The sampling moment of a current sampled value whose count value is a first value in the plurality of current sampled values is a moment of generation of a PPS signal of a satellite positioning module of the merging unit 401.

Figure 6:
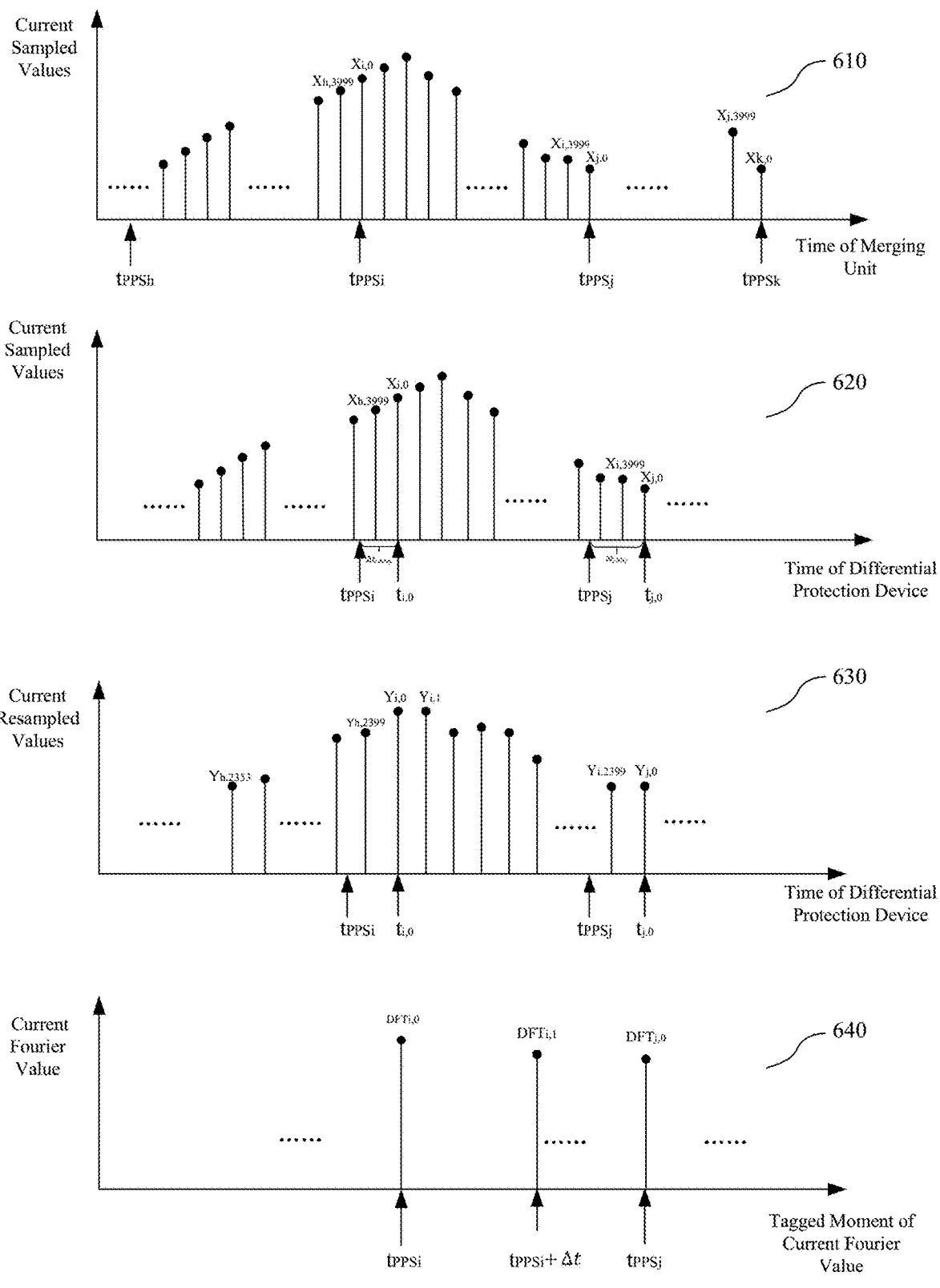
FIG. 6 is a schematic diagram of a data transformation of a time alignment method according to embodiments of this disclosure.

Illustration 610 in FIG. 6 shows one example of current sampled values obtained by sampling the current analog values measured by the current transformer CT1 by the merging unit 401. Wherein, $t_{ppsh}$, $t_{ppsi}$, $t_{ppsj}$ and $t_{ppsk}$ indicate the moments of generation of the h-th PPS signal $PPS_h$, the i-th PPS signal $PPS_i$, the j-th PPS signal $PPS_j$ and the k-th PPS signal $PPS_k$, respectively, generated successively by the satellite positioning module of the merging unit 401. The merging unit 401 samples N current sampled values per second. For example, there are N current sampled values $X_{i,0}$~$X_{i,N-1}$ arranged between the generation moment $t_{ppsi}$ of the i-th PPS signal $PPS_i$ and the generation moment $t_{ppsj}$ of the j-th PPS signal $PPS_j$, where $X_{i,0}$ is the current sampled value sampled at the generation moment $t_{ppsi}$ of the i-th PPS signal $PPS_i$. N is an integer greater than 1.

Here, depending on the sampling control method between the merging unit 401 and the current transformer CT1, the original current sampled values obtained by the merging unit 401 by sampling the current analog values may not include the current sampled values whose sampling moment happens to be the generation moments of $t_{ppsh}$, $t_{ppsi}$, $t_{ppsj}$ and $t_{ppsk}$ of the respective PPS signals. By interpolating the original current sampled values, some current sampled values whose sampling moments are the generation moments $t_{ppsh}$, $t_{ppsi}$, $t_{ppsj}$ and $t_{ppsk}$ of the respective PPS signals are produced, as shown in illustration 610. Since interpolation is a technique well known in the art and to avoid obscuring this disclosure, this operation is not described in detail in this disclosure.

The merging unit 401 transmits each sample value to the differential protection device 402 in the form of sampled value packet (e.g., conforming to standard IEC61850-9-2, etc.). Each sampled value packet is tagged with SmpCnt (hereinafter referred to as SC) indicating the count value of the sampled value. The count value is tagged in unit of the number of N current sampled values contained between the two generation moments of two consecutive PPS signals. The N current sample values contained between the two generation moments of two consecutive PPS signals are referred to as one set of current sampled values herein. The plurality of current sampled values includes at least one set of current sampled values, and the count values of the N current sampled values of each set of current sampled values are tagged from 0 to N−1 in chronological order, and the first value of the count value is 0.

For example, as shown in illustration 610, the horizontal axis represents the time of the merging unit 401, and the vertical axis represents the current sampled values obtained by the merging unit 401. For example, given the power frequency of 50 Hz and the sampling frequency of 80 points/cycle of the merging unit, the merging unit 401 samples 4000 current sampled values per second, i.e., N=4000. The i-th set of current sampled values includes N current sampled values $X_{i,0}$~$X_{i,3999}$ arranged between the generation moment $t_{ppsi}$ of the i-th PPS signal $PPS_i$ and the generation moment $t_{ppsi}$ of the j-th PPS signal PPSj, and their count values are $SC_{i,0}$~$SC_{i,3999}$, respectively. Similarly, the j-th set of current sampled values after the i-th current sampled value includes the N current sampled values $X_{j,0}$~$X_{j,3999}$ arranged between the generation time $t_{ppsj}$ of the j-th PPS signal PPSj and the generation time tppsk of the k-th PPS signal $PPS_k$, and their count values are $SC_{j,0}$~$SC_{j,3999}$, respectively.

Illustration 620 in FIG. 6 shows an example of the current sampled values received by the differential protection device 402 from the merging unit 401. The horizontal axis of illustration 620 indicates the time of the differential protection unit 401 and the vertical axis indicates the current sampled value received by the differential protection unit 401. The differential protection device 402 receives the sampled value packet generated by the merging unit 401 via the process bus. A large transmission delay of the process bus results in, for example, the time distance $\Delta t_{i,delay}$ between the moment ti,0 when the differential protection device 402 receives the current sampled value $X_{i,0}$ whose count value is the first value $SC_{i,0}$ in the i-th set of current sampled values and the generation moment $t_{ppsi}$ when the satellite positioning system of the differential protection device 402 generates the i-th PPS signal $PPS_i$ and the time distance $\Delta t_{j,delay}$ between the moment $t_{j,0}$ when the differential protection device 402 receives the current sampled value $X_{j,0}$ whose count value is the first value $SC_{j,0}$ in the j-th set of current sampled values and the generation moment $t_{ppsj}$ when the satellite positioning system of the differential protection device 402 generates the j-th PPS signal $PPS_j$, and the like. In some examples, the merging unit 401 can transmit the sampled value packet in real time, but the time distances $\Delta t_{i,delay}$ and $\Delta t_{j,delay}$ may be different, since the transmission delay of the process bus may be unstable due to the change of various interference factors over time.

At step S520, the differential protection device 402 resamples the plurality of current sampled values according to sampling frequency of J points/cycle (J is an integer greater than 1) to obtain the plurality of current resampled values. The plurality of current resampled values includes the reference current resampled values corresponding to the current sampled values whose count value is the first value in the plurality of current sampled values.

Since the sampling frequency of the differential protection device 402 is often different from the sampling frequency of the merging unit 401, the differential protection device 402 needs to resample multiple current sampled values. The resampling can be done by linear interpolation or other similar ways to produce M current resampling values per second. After resampling, the current resampled value corresponding to the current sampled value whose count value is the first value is used as the reference current resampled value.

Illustration 630 in FIG. 6 is an example of the plurality of current resampled values obtained by the differential protection device 402 by resampling the current sampled values in illustration 620. The horizontal axis of illustration 630 indicates the time of the differential protection device 402 and the vertical axis indicates the current resampled values obtained by the differential protection device 401. Since the time duration for the resampling operation by the differential protection device 402 is negligible with respect to the calculation accuracy of the differential current, the time duration for the resampling operation by the differential protection device 401 is not considered in illustration 630. Given the power frequency of 50 Hz and the sampling frequency of J=48 points/cycle of differential protection device 402, the resampling produces M=2400 current resampled values per second, such as current resampled values $Y_{i,0}$ to $Y_{i,2399}$, as shown in illustration 630.

The M current resampled values corresponding to one set of current sampling values are referred to as one set of current resampled values herein. The plurality of resampled values obtained by the differential protection device 402 includes at least one set of current resampled values. At least one set of current resampled values as shown in illustration 630 corresponds to at least one set of current sampled values as shown in illustration 620 one by one. The first current resampling value in each set of current resampling values is used as the reference current resampled value.

As shown in illustration 630, the i-th set of current resampled values includes 2400 current resampled values $Y_{i,0}\sim Y_{i,2399}$ corresponding to the i-th set of current sampled values $X_{i,0}\sim X_{i,3999}$. The first current resampled value $Y_{i,0}$ corresponds to the current sampled value $X_{i,0}$ whose count value is the first value and thus is used as the reference current resampled value for the i-th set of current resampled values. The j-th set of current resampled values immediately after the i-th set of current sampled values includes 2400 current resampled values $Y_{j,0}\sim Y_{i,2399}$ corresponding to the j-th set of current sampled values $X_{j,0}\sim X_{j,3999}$. The first current resampled value $Y_{j,0}$ corresponds to the current sampled value $X_{j,0}$ whose count value is the first value and thus is used as the reference current resampled value for the j-th set of current resampled values.

In addition, depending on the demand for accuracy of the differential current calculation, the differential protection device 402 can resample the current sampling values more than once. For example, considering the demand for further noise reduction, filtering or reducing the amount of calculation, current sampled values may be resampled multiple times.

At step S530, Fourier transform is performed on the plurality of current resampled values to obtain a plurality of temporally arranged current Fourier values. The plurality of temporally arranged current Fourier values include the reference current Fourier value corresponding to the sampling moment of the current sampled value whose count value is the first value. The reference current Fourier value is determined based on the reference current resampled value and the J−1 current resampled values that temporally arranged before the reference current resampled value.

As shown in illustration 640, the obtained plurality of temporally arranged current Fourier values may include at least one set of current Fourier values. For example, the i-th set of current Fourier values including G temporally arranged current Fourier values $DFT_{i,0}\sim DFT_{i,G-1}$ corresponding to the current resampled values $Y_{i,0}\sim Y_{i,M-1}$, respectively. $DFT_{i,0}$ is the current Fourier value corresponding to the reference current resampled value $Y_{i,0}$ and also corresponding to the current sampling value $X_{i,0}$ whose count value is the first value and thus is used as the reference current Fourier value of the i-th set of current Fourier values. The j-th set of current Fourier value includes G temporally arranged current Fourier values $DFT_{j,0}\sim DFT_{i,G-1}$ corresponding to the current resampled values $Y_{j,0}\sim Y_{j,M-1}$, respectively. $DFT_{ji,0}$ is the current Fourier value corresponding to the reference current resampled value $Y_{j,0}$ and also corresponding to the current sampled value $X_{j,0}$ whose count value is the first value and thus is used as the reference current Fourier value of the j-th set of current Fourier values, and the like.

According to the principle of Fourier transform, for multiple current resampled values obtained with the resampling frequency of J points/cycle, the Fourier transform can be performed by iteratively, at interval of K current resampled values, taking J consecutive current resampled values and performing Fourier transform on the taken J consecutive current resampled values. Then the number of current Fourier values contained in each set of Fourier value is $G=\lfloor M/K \rfloor$, where the symbol " $\lfloor\rfloor$" indicates round-down operation, and G is an integer.

Obtaining a plurality of current Fourier values by the differential protection device 402 includes obtaining each of the at least one set of current Fourier values.

Take obtaining the i-th set of current Fourier values $DFT_{i,0}\sim DFT_{i,G-1}$ as an example to explain the process of the Fourier transforms.

Firstly, the first current Fourier value $DFT_{i,0}$ in the i-th set of current Fourier values is obtained. As shown in illustration 640 and given the resampling frequency of 48 points/cycle, the first current Fourier value $DFT_{i,0}$ is obtained by taking the reference current resampled value $Y_{i,0}$ of the i-th set of current resampled values and the 47 current resampled values temporally arranged before the reference current resampled value, i.e., $Y_{h,2353}\sim Y_{i,0}$, as transform objection and perform Fourier transform on the transform objection of $Y_{h,2353}\sim Y_{i,0}$. Since the first current Fourier value $DFT_{i,0}$ corresponds to the reference current resampled value $Y_{i,0}$ and the reference current resampled value $Y_{i,0}$ corresponds to the current sampled value $X_{i,0}$ whose count value is the first value, this first current Fourier value $DFT_{i,0}$ corresponds to the current sampled value $X_{i,0}$ whose count value is the first value and thus is used as the reference current Fourier value of the i-th set of current Fourier values.

Then, the second current Fourier value $DFT_{i,1}$ of the i-th set of current Fourier value is obtained. As shown in illustration 640 and given the interval K of 6, the second current Fourier value $DFT_{i,1}$ is obtained by taking the 48 current resampled values $Y_{h,2359}\sim Y_{i,6}$ as transform objection and performing Fourier transform on the transform objection of $Y_{h,2359}\sim Y_{i,6}$. The 48 current resampled values $Y_{h,2359}\sim Y_{i,6}$ are obtained by moving 6 current resampled values backward in time from the 48 current resampled values $Y_{h,2353}\sim Y_{i,0}$.

Similar to obtaining the second current Fourier value $DFT_{i,1}$, for each of the third to G-th current Fourier values $DFT_{i,2}$ to $DFT_{i,399}$, it is obtained by taking the 48 current resampled values obtained by moving 6 current resampling values backward in time from the 48 current resampled values for the previous Fourier value and performing Fourier transform on the taken 48 current resampled values.

All current Fourier values corresponding to the current resampled values shown in illustration 630 can be obtained in the same way.

In addition, in the case where the differential protection device 402 resamples the current sampling values multiple times, J is the sampling frequency of the last resampling.

In this way, according to the time alignment method of the embodiment of this disclosure, the first current Fourier values, e.g., $DFT_{i,0}$, $DFT_{j,0}$, in respective sets of the obtained current Fourier values are used as the reference current Fourier values corresponding to respective current sampling values whose count value are the first value, e.g., $X_{i,0}$, $X_{j,0}$, respectively. The respective current sampling values whose count value, e.g., $X_{i,0}$, $X_{j,0}$, are the first value corresponds to the respective generation moments, e.g., $t_{PPSi}$, $t_{ppSi}$, of the PPS signals, e.g., $PPS_i$, $PPS_j$, of the satellite positioning module of the merging unit. Therefore, the respective first current Fourier values, e.g., $DFT_{i,0}$, $DFT_{j,0}$, as the reference current Fourier values, are aligned with the respective generation moments of the corresponding PPS signals, e.g., $PPS_i$, $PPS_j$.

The time alignment method according to embodiments of this disclosure may further include step 540 of tagging each of the plurality of obtained current Fourier values with the moment for use in differential current calculation by an external device. The external device may be, for example, a differential protection device 404 at the other end of the power line L or another device that collects current information for both end A and end B of the power line L. Tagging each of the plurality of obtained current Fourier values with moment includes tagging respective current Fourier values of each set of current Fourier values with respective time-aligned moments.

Take the current Fourier values $DFT_{i,0}$~$DFT_{i,G-1}$ of the i-th set of current Fourier values as an example to explain the process of tagging moments for current Fourier values.

Firstly, the reference current Fourier value in the i-th set of current Fourier values is tagged with the moment. As mentioned earlier, the respective first current Fourier values $DFT_{i,0}$ and $DFT_{j,0}$, as the reference current Fourier values, are aligned with the respective generation moments of the corresponding PPS signals $PPS_i$ and $PPS_j$, respectively. Therefore, as shown in illustration 640, The first current Fourier value (i.e., the reference current Fourier value) in the i-th set of current Fourier values is tagged with the generation moment $t_{ppSi}$ of the PPS signal $PPS_i$ corresponding to the first current Fourier value.

Then, each of the second to G-th current Fourier values in the i-th set of current Fourier values is tagged with the corresponding moment. The moment of the Q-th ($2 \leqslant G$) current Fourier value in the i-th set of current Fourier values is tagged as the moment of the reference current Fourier value plus $(Q-1)*\Delta t$, $\Delta t$=(duration of 1 cycle)/(J/K). For example, given the power frequency of 50 Hz, the resampling frequency of J=48 points/cycle of the differential protection device 402 and the consecutive 48 current resampling values for calculating respective current Fourier values are taken by moving K=6 current resampling values backward in time from the consecutive 48 current resampling values for the previous Fourier value, $\Delta t$=20 ms/(48/6)=2.5 ms, the moment of the second current Fourier value in the i-th set of current Fourier values is tagged as $t_{PPSi}$+2.5 ms, the moment of the third current Fourier value in the i-th set of current Fourier values is tagged as $t_{PPSi}$+5 ms, and the like.

In addition, as mentioned earlier, in some examples, the time distances $\Delta t_{i,delay}$ and $\Delta t_{j,delay}$ in illustration 620 may be different due to the unstable transmission delay between the merging unit 401 and the differential protection unit 402, which may result in a different number G of current Fourier values in different current Fourier sets.

Referring to illustration 620, the time distances $\Delta t_{i,delay}$ and $\Delta t_{j,delay}$ may be different. In other words, the time distance between the two reception moments at which the two adjacent current sampled values whose count value are the first value in two adjacent sets of current sampled values are received by the differential protection device 402, e.g., the time distance between tj,0 and ti,0 is not always equal to 1 second. For example, The time distance between tj,0 and ti,0 is greater than is when $\Delta t_{j,delay}$>$\Delta t_{i,delay}$ and is less than is when $\Delta t_{j,delay}$<$\Delta t_{i,delay}$, which may cause different number G of current Fourier values in the different set of current Fourier values.

Given the power frequency of 50 Hz and the resampling frequency of J=48 points/cycle of the differential protection device 402. In the case where $\Delta t_{j,delay} \geqslant \Delta t_{i,delay}$ and thus $t_{j,0}-t_{i,0} \geqslant 1$, the differential protection device 402 calculates the first Fourier value $DFT_{i,0}$ in the i-th set of current Fourier values at the moment $t_{i,0}$, and then calculates the second Fourier value $DFT_{i,1}$, and the like, until the $DFT_{i,399}$ is calculated. After that, the differential protection device 402 waits for the arrival of moment $t_{j,0}$ to calculate the first Fourier value $DFT_{j,0}$ in the j-th set of current Fourier values. Thus, the number G of current Fourier values in the i-th set of current Fourier values is 400, i.e., G=400.

However, in the case where $\Delta t_{j,delay}$<$\Delta t_{i,delay}$ and thus $t_{j,0}-t_{i,0}$<1 s, it may happen that the differential protection device 402 receives the current sample value whose current is the first value in the j-th set of the current Fourier values before calculating the last one or more current Fourier values in the i-th set of current Fourier values. The differential protection device 402 then stops calculating the last one or more current Fourier values in the i-th set of current Fourier and to immediately calculate the first current Fourier value $DFT_{j,0}$ in the j-th set of current Fourier values. Thus, the number G of current Fourier values in the i-th set of current Fourier is less than 400, G<400.

The differential protection apparatus 402 using the above-described time alignment method according to embodiments of this disclosure may obtain current information I1 of end A of the power line L. The current information I1 includes the current Fourier values of end A tagged with the time-aligned moments. This current information may be sent to an external device for use in calculating the differential current of the power line L.

Comparing to the time alignment method according to the prior art, instead of using the PPS signal generated by the differential protection device's own satellite positioning module as the reference time to calculate the current Fourier values, the time alignment method 500 according to the embodiment of this disclosure considers the transmission delay between the merging unit and the differential protection device and uses the current sampled values tagged with SmpCnt=0 (i.e., count value is the first value) received by the differential protection device from the merging unit as the reference time to align the respective current Fourier values to the respective sampling moments of the respective current values corresponding to the current Fourier values.

As a result, the accuracy of the time alignment of the current Fourier values is improved and thus the reliability of the differential current calculated from the current Fourier values is improved so that incorrect differential protection decisions can be avoided in the case of large changes in current amplitude over a short period of time (e.g., through faults, etc.).

Figure 7:
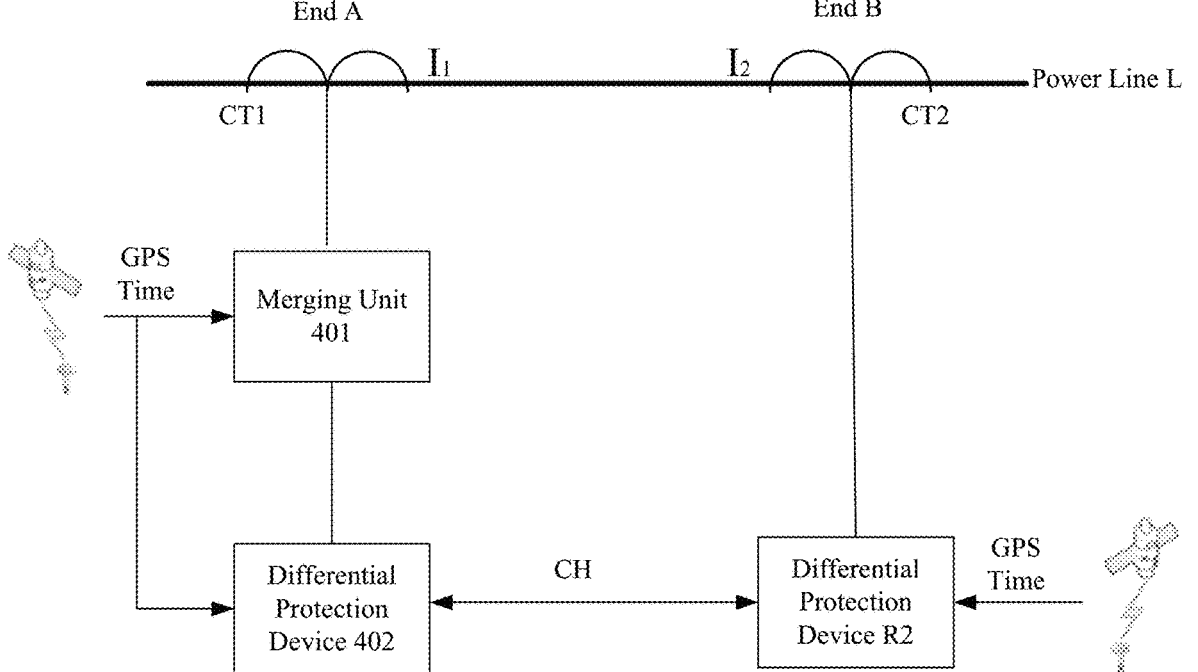
FIG. 7 is a diagram of another example usage scenario of a time alignment method according to embodiments of this disclosure.

FIG. 7 is a diagram of another example usage scenario for the time alignment method according to an embodiment of this disclosure.

The above-described time alignment method 500 according to an embodiment of this disclosure is also applicable to the scenario shown in FIG. 7. Referring to FIG. 7, end A of power line L has the same arrangement as end A of FIG. 4, and end B has the same arrangement as end B of FIG. 2. Differential protection device 402 at end A performs the time alignment method 500 according to the presently disclosed embodiment to obtain the time aligned current information I1 at end A. The time aligned current information I1 includes the current Fourier values of the current tagged with the aligned moment at end A. Differential protection device R2 at end B performs the time alignment method 500 according to the prior art as described above in connection with FIG. 2 to obtain the time aligned current information I2 at end B. The time aligned current information I2 includes the current Fourier values of the current tagged with the aligned moment at the B. After exchanging the current information I1 and I2 via the communication channel CH, the differential protection devices 402 and R2 are able to calculate the differential current of the power line L and thus make a correct differential protection decision based on the differential protection principle shown in FIG. 1.

Figure 8:
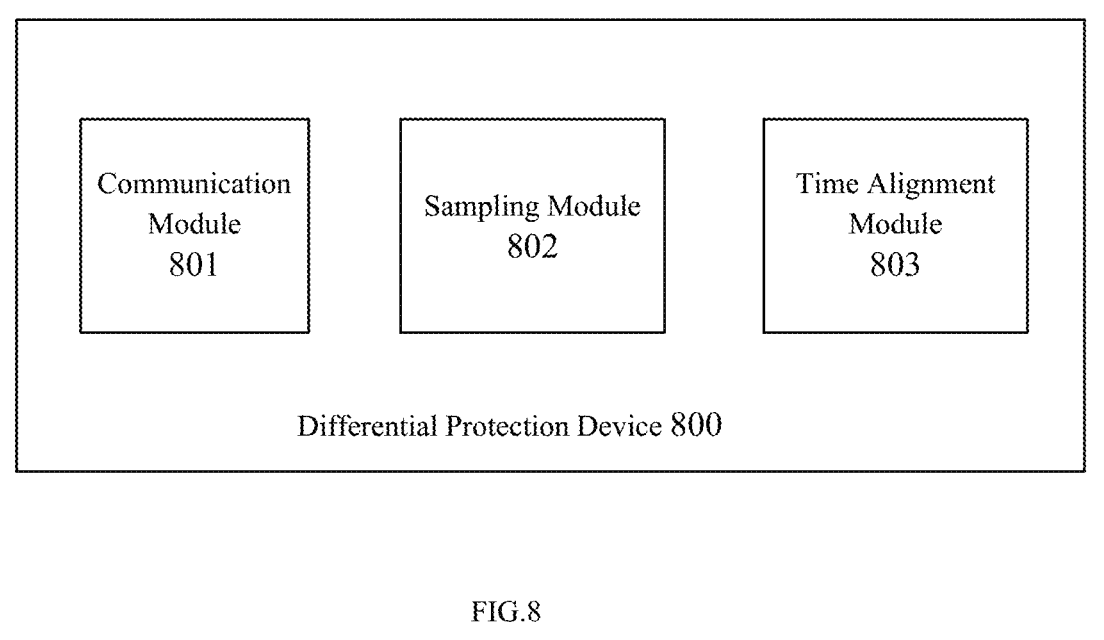

FIG. 8 is a schematic block diagram of a differential protection device according to an embodiment of this disclosure.

Referring to FIG. 8, the differential protection device 800 (e.g., differential protection devices 401, 402 in FIG. 4) according to an embodiment of this disclosure includes a communication module 801, a sampling module 802 and a time alignment module 803.

The communication module 801 is configured to obtain a plurality of current sampled values of the power line L from the merging unit of the power line L and the count value of each of the plurality of current sampled values. The respective sampling moments of the respective current sampled values whose count value are the first value in the plurality of current sampled values are the respective generation moments of the respective PPS signals generated by the first satellite positioning system module of the merging unit.

The sampling module 802 is configured to resample a plurality of current sampling values according to the sampling frequency J points/cycle of the differential protection device to obtain a plurality of current resampled values. The plurality of current resampled values includes the reference current resampled values corresponding to the current sampled values whose count values are the first value in the plurality of current sampling values.

The time alignment module 803 is configured to perform Fourier transform on the plurality of current resample values to obtain a temporally arranged plurality of current Fourier values. The plurality of current Fourier values includes respective reference current Fourier values corresponding to the respective sampling moments of the respective current sample values whose count values are the first value. The respective reference current Fourier values are determined based on the respective reference current resample value and the J−1 current resample values temporally arranged before the reference current resample value.

In addition, the differential protection device 402 may include a satellite positioning module 804 (not shown) for receiving a reference time source from the time-giving system and generating a PPS signal.

Since the process of performing the time alignment method 500 according to the embodiment of this disclosure by the differential protection device 402, 404 according to the embodiment of this disclosure has been described in detail previously in connection with FIGS. 5 and 6, it will not be repeated here to avoid repetition.

Figure 9:
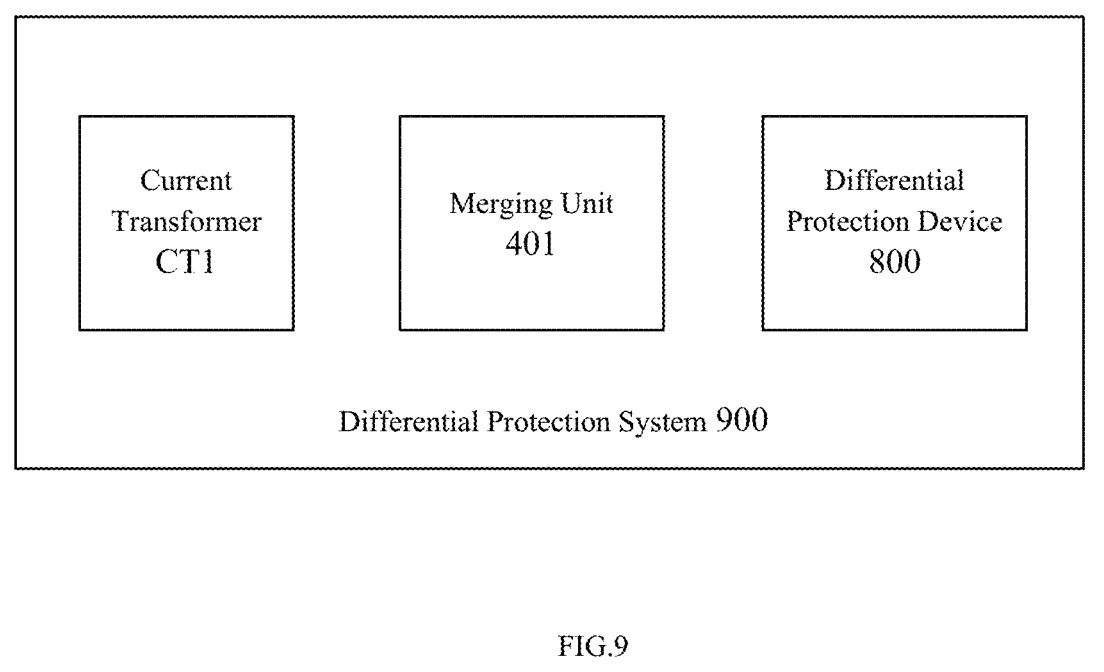

FIG. 9 is a schematic block diagram of a differential protection system 900 according to embodiments of this disclosure.

Referring to FIG. 9, the differential protection system 900 according to embodiments of this disclosure includes a current transformer such as the current transformers CT1 and CT2 shown in FIG. 2, FIG. 4, and FIG. 7, a merging unit such as the merging unit 401 and 403 shown in FIG. 4 and FIG. 7, and a differential protection device such as the differential protection device 800 shown in FIG. 8.

The current transformer is used to measure the current analog values of the power line.

The merging unit is used to generate a plurality of original current sampled values by sampling the current analog values, obtain a plurality of current sampled values by interpolating the plurality of original current sampled values, and tag each of the plurality of current sampled values with a count value. The sampling moment of the current sampled value whose count value is the first value in the plurality of current sampled values is the generation moment of a PPS signal generated by the satellite positioning module of the merging unit.

The differential protection device e.g., the differential protection device 800, obtains the plurality of current sampled values of the power line and the count value of each of the plurality of current sampled values from the merging unit of the power line. The sampling moment of the current sampled value whose count value is the first value in the plurality of current sampled values is the generation moment of a PPS signal generated by the satellite positioning module of the merging unit. The differential protection device further resamples the plurality of current sampled values according to a sampling frequency of J points/cycle to obtain a plurality of current resampled values. The plurality of current resampled values include the reference current resampled value corresponding to the current sampled values whose count value are the first value. J is an integer greater than 1. The differential protection device further performs Fourier transform on the plurality of current resampled values to obtain a plurality of temporally arranged current Fourier values. The plurality of current Fourier values include the reference current Fourier value corresponding to the sampling moment of the current sampled value whose count value is the first value in the plurality of current sampled values. The reference current Fourier value is determined based on the reference current resampled value and the J−1 current resampled values that temporally arranged before the reference current resampled value.

Since the process of implementing the time alignment method 500 by the current transformer CT1, the merging unit 401 and the differential protection device 402 in cooperation according to the embodiments of this disclosure has been described in detail previously in connection with FIGS. 5 and 6, it will not be repeated here to avoid repetition.

The time alignment method, differential protection device and differential protection system according to the embodiments of this disclosure consider the impact of the transmission delay caused by the transmission of the current sampled value packets between the process level and the bay level of the substation automation system via the process bus on the calculation of the differential current of the power line L, and thus are applicable to the time alignment of the substation automation system using the process bus for communication. Aligning the respective current Fourier values to the sampling moment of its corresponding current value by using the current sampled values tagged with SmpCnt=0 (i.e., the count value is the first value) received by the differential protection device from the merging unit as reference, the accuracy of the calculated differential current is improved which brings significant benefits for the safety of the electrical system.

It should be understood by those skilled in the art that the specific embodiments described above are only examples and not limitations, and that various modifications, combinations, partial combinations, and substitutions of embodiments of this disclosure may be made based on design requirements and other factors, provided they are within the scope of the appended claims or their equivalents, which are within the scope of the rights to be protected by this disclosure.

The invention claimed is:

1. A time alignment method for a differential protection device for a power line, comprising:

obtaining, from a merging unit of the power line, a plurality of current sampled values of the power line and a count value of each of the plurality of current sampled values, wherein a sampling moment of a current sampled value whose count value is a first value in the plurality of current sampled values is a moment of generation of a pulse per second (PPS) signal of a satellite positioning module of the merging unit;

resampling the plurality of current sampled values according to a sampling frequency of J points/cycle of the differential protection device to obtain a plurality of current resampled values, wherein the plurality of current resampled values comprises a reference current resampled value corresponding to the current sampled value whose count value is the first value, wherein J is an integer greater than 1; and performing Fourier transform on the plurality of current resampled values, via the differential protection device, to obtain a plurality of temporally arranged current Fourier values, wherein the plurality of current Fourier values comprises (i) at least one set of the current Fourier values each comprising G current Fourier values, wherein a first current Fourier value of the each set of the current Fourier values is used as a reference current Fourier value, where G is an integer greater than 1, and (ii) the reference current Fourier value corresponds to the sampling moment of the current sampled value whose count value is the first value in the plurality of current sampled values, and the reference current Fourier value is determined based on the reference current resampled value and J−1 current resampled values that are temporally arranged before the reference current resampled value, and wherein performing the Fourier transform on the plurality of current resampled values to obtain a plurality of temporally arranged current Fourier values comprises:

performing Fourier transform by taking the reference current resampled value and J−1 current resampled values that are temporally arranged before the reference current resampled value as a transform object for the Fourier transform to obtain the first current Fourier value of the set of current Fourier values as the reference current Fourier value; and iteratively performing Fourier transform G−1 times to obtain second to G-th current Fourier values of the set of current Fourier values, wherein each of the G−1 Fourier transforms is performed by taking J current resampled values obtained by moving K current resampled values backward in time from the transform object for the previous Fourier transform, wherein G=[M/K] and [M/K] is a carry out round-down operation on M/K; and triggering a differential protection action for the power line via the differential protection device based on the temporally arranged current Fourier values.

2. The time alignment method of claim 1, wherein, the plurality of current sampled values comprises at least one set of current sampled values, each of the at least one set of current sampled values comprises N current sampled values between the moments of generation of the two PPS signals, the count values of the N current sampled values are tagged from 0 to N−1 in chronological order, where the first value is O and the N is an integer greater than 1.

3. The time alignment method of claim 2, wherein, the plurality of current resampled values comprises at least one set of current resampled values corresponding to the at least one set of current sampled values one by one, each of the at least one set of current resampled values comprises M current resampled values, a first current resampled value of the each set of current resampled values is used as the reference current resampled value, where M is an integer greater than 1.

4. The time alignment method of claim 1, further comprising tagging a moment of each of the plurality of current Fourier values, comprising:

for the each set of current Fourier values:

tagging a moment of the reference current Fourier value of the set of current Fourier values as the sampling moment of the current sampled value which corresponds to the reference current Fourier value and has count value of the first value;

tagging a moment of the Q-th current Fourier value of the set of current Fourier value as the moment of the reference current Fourier value plus (Q−1)*Δt, wherein the Q is an integer greater than 1 and not greater than G, and the Δt=(duration of 1 cycle)/(J/K).

5. The time alignment method of claim 1, wherein obtaining each of the at least one set of current Fourier values further comprises:

stopping obtaining the current Fourier values of the set of current Fourier value that has not yet been obtained and to obtain the reference current Fourier value of the subsequent set of current Fourier values relative to the set of current Fourier value, in response to receive a current sampled value which corresponds to the reference current Fourier value of the subsequent set of current Fourier values and has count value of the first value.

6. The time alignment method of claim 5, further comprising:

sending the plurality of current Fourier values to an external device for calculating the differential current of the power line.

7. The time alignment method of claim 1, wherein the satellite positioning module comprises a global positioning system-based positioning module or a BeiDou-based positioning module.

8. The time alignment method of claim 1, wherein the plurality of current sampling values are obtained by the merging unit interpolating the original current sampled values resulting from sampling the current analog values of the power line, the current analog values are measured by a current transformer of the power line.

9. A differential protection device for a power line, wherein the differential protection device is configured to:

obtain, from a merging unit of the power line, a plurality of current sampled values of the power line and a count value of each of the plurality of current sampled values, a sampling moment of a current sampled value whose count value is a first value in the plurality of current sampled values is a moment of generation of a pulse per second (PPS) signal of a satellite positioning module of the merging unit;

resample the plurality of current sampled values according to a sampling frequency of J points/cycle of the differential protection device to obtain a plurality of current resampled values, the plurality of current resampled values comprises a reference current resampled value corresponding to the current sampled value whose count value is the first value, wherein J is an integer greater than 1;

perform a Fourier transform on the plurality of current resampled values to obtain a plurality of temporally arranged current Fourier values, wherein the plurality of temporally arranged current Fourier values comprises (i) at least one set of current Fourier values each comprising G current Fourier values, a first current Fourier value of the each set of current Fourier values is used as a reference current Fourier value, where G is an integer greater than 1, and (ii) a reference current Fourier value corresponding to the sampling moment of the current sampled value whose count value is the first value in the plurality of current sampled values, wherein the reference current Fourier value is determined based on the reference current resampled value and the J−1 current resampled values that temporally arranged before the reference current resampled value, and wherein the differential protection device is configured to perform the Fourier transform on the plurality of current resampled values by:

taking the reference current resampled value and J−1 current resampled values that are temporally arranged before the reference current resampled value as a transform object for the Fourier transform to obtain the first current Fourier value of the set of current Fourier values as the reference current Fourier value; and performing the Fourier transform G−1 times iteratively to obtain the second to G-th current Fourier values of the set of current Fourier values, wherein each of G−1 Fourier transforms is performed by taking J current resampled values obtained by moving K current resampled values backward in time from the transform object for the previous Fourier transform, wherein G=[M/K] and [M/K] is a carry out round-down operation on M/K; and initiate a differential protection action for the power line based on the temporally arranged current Fourier values.

10. The differential protection device of claim 9, wherein, the plurality of current sampled values comprises at least one set of current sampled values, each of the at least one set of current sampled values comprises N current sampled values between the moments of generation of the two PPS signals, the count values of the N current sampled values are tagged from 0 to N−1 in chronological order, where the first value is 0 and the N is an integer greater than 1.

11. The differential protection device of claim 10, wherein, the plurality of current resampled values comprises at least one set of current resampled values corresponding to the at least one set of current sampled values one by one, each of the at least one set of current resampled values comprises M current resampled values, a first current resampled value of the each set of current resampled values is used as the reference current resampled value, where M is an integer greater than 1.

12. The differential protection device of claim 9, wherein the wherein the differential protection device is configured to tag the moment of each current Fourier value of the plurality of current Fourier values by applying the following operations on each set of current Fourier values:

tagging a moment of the reference current Fourier value of the set of current Fourier values as the sampling moment of the current sampled value which corresponds to the reference current Fourier value and has count value of the first value; and tagging a moment of the Q-th current Fourier value of the set of current Fourier value as the moment of the reference current Fourier value plus ((Q−1)*Δt, wherein the Q is an integer greater than 1 and not greater than G, and the Δt=(duration of 1 cycle)/(J/K).

13. The differential protection device of claim 9, wherein the differential protection device is configured to stop obtaining the current Fourier values of the set of current Fourier value that has not yet been obtained and to obtain the reference current Fourier value of the subsequent set of current Fourier values relative to the set of current Fourier value, in response to receive a current sampled value which corresponds to the reference current Fourier value of the subsequent set of current Fourier values and has count value of the first value.

14. The differential protection device of claim 13, wherein the differential protection device is further configured to send the plurality of current Fourier values to an external device for calculating a differential current of the power line.

15. A differential protection system for a power line, comprising:

a current transformer, configured for measuring current analog values of the power line;

a merging unit, configured for generating a plurality of original current sampled values by sampling the current analog values, obtaining a plurality of current sampled values by interpolating the plurality of original current sampled values, and tagging each current sampled value with a count value, a sampling moment of a current sampled value whose count value is a first value in the plurality of current sampled values is a moment of generation of a pulse per second (PPS) signal of a satellite positioning module of the merging unit; and the differential protection device of claim 9.

16. The time alignment method of claim 1, wherein triggering the differential protection action for the power line via the differential protection device includes disconnecting an associated circuit breaker.

17. The differential protection device of claim 9, wherein the differential protection device is configured to disconnect an associated circuit breaker as the differential protection action for the power line.

18. A differential protection device for a power line, wherein the differential protection device is configured to:

obtain, from a merging unit of the power line, a plurality of current sampled values of the power line and a count value of each of the plurality of current sampled values, a sampling moment of a current sampled value whose count value is a first value in the plurality of current sampled values is a moment of generation of a pulse per second (PPS) signal of a satellite positioning module of the merging unit;

resample the plurality of current sampled values according to a sampling frequency of J points/cycle of the differential protection device to obtain a plurality of current resampled values, the plurality of current resampled values comprises a reference current resampled value corresponding to the current sampled value whose count value is the first value, wherein J is an integer greater than 1;

perform a Fourier transform on the plurality of current resampled values to obtain a plurality of temporally arranged current Fourier values, wherein the plurality of temporally arranged current Fourier values comprises (i) at least one set of current Fourier values each comprising G current Fourier values, a first current Fourier value of the each set of current Fourier values is used as a reference current Fourier value, where G is an integer greater than 1, and (ii) a reference current Fourier value corresponding to the sampling moment of the current sampled value whose count value is the first value in the plurality of current sampled values, wherein the reference current Fourier value is determined based on the reference current resampled value and the J−1 current resampled values that temporally arranged before the reference current resampled value, and wherein the differential protection device is configured to perform the Fourier transform on the plurality of current resampled values by:

taking the reference current resampled value and J−1 current resampled values that are temporally arranged before the reference current resampled value as a transform object for the Fourier transform to obtain the first current Fourier value of the set of current Fourier values as the reference current Fourier value; and performing the Fourier transform G−1 times iteratively to obtain the second to G-th current Fourier values of the set of current Fourier values, wherein each of G−1 Fourier transforms is performed by taking J current resampled values obtained by moving K current resampled values backward in time from the transform object for the previous Fourier transform, wherein G=[M/K] and [M/K] is a carry out round-down operation on M/K; and initiate a differential protection action for the power line based on the temporally arranged current Fourier values; and wherein the differential protection device is configured to tag the moment of each current Fourier value of the plurality of current Fourier values by applying the following operations on each set of current Fourier values:

tagging a moment of the reference current Fourier value of the set of current Fourier values as the sampling moment of the current sampled value which corresponds to the reference current Fourier value and has count value of the first value;

tagging a moment of the Q-th current Fourier value of the set of current Fourier value as the moment of the reference current Fourier value plus ((Q−1)*Δt, wherein the Q is an integer greater than 1 and not greater than G, and the Δt=(duration of 1 cycle)/(J/K); and stop obtaining the current Fourier values of the set of current Fourier value that has not yet been obtained and obtaining the reference current Fourier value of the subsequent set of current Fourier values relative to the set of current Fourier value, in response to receive a current sampled value which corresponds to the reference current Fourier value of the subsequent set of current Fourier values and has count value of the first value.

\* \* \* \* \*